United States Patent [19]

Fukushima et al.

[11] 4,429,388
[45] Jan. 31, 1984

[54] FIELD PROGRAMMABLE DEVICE WITH INTERNAL DYNAMIC TEST CIRCUIT

[75] Inventors: Toshitaka Fukushima, Yokohama; Kazumi Koyama, Tsukui; Kouji Ueno, Kawasaki, all of Japan

[73] Assignee: Fujitsu Limited, Kawasaki, Japan

[21] Appl. No.: 214,210

[22] Filed: Dec. 8, 1980

[30] Foreign Application Priority Data

Dec. 18, 1979 [JP] Japan .................................. 54-164333

[51] Int. Cl.³ ............................................ G06F 11/22
[52] U.S. Cl. ........................................ 371/21; 371/51
[58] Field of Search ............................. 371/21, 24, 51; 324/73 R; 365/201

[56] References Cited

U.S. PATENT DOCUMENTS

| | | | |
|---|---|---|---|
| 3,063,636 | 11/1962 | Sierra | 371/51 X |
| 3,221,310 | 11/1965 | Reach, Jr. | 371/51 X |
| 3,633,016 | 1/1972 | Walker et al. | 371/24 |
| 3,944,800 | 3/1976 | Beck et al. | 365/201 X |
| 3,995,215 | 11/1976 | Chu et al. | 371/21 X |
| 4,176,258 | 11/1979 | Jackson | 324/73 R X |
| 4,253,059 | 2/1981 | Bell et al. | 324/73 R |
| 4,312,067 | 1/1982 | Shirasaka | 371/25 |
| 4,320,507 | 3/1982 | Fukushima et al. | 371/21 |

Primary Examiner—David H. Malzahn
Attorney, Agent, or Firm—Staas & Halsey

[57] ABSTRACT

A field programmable device comprising a memory cell part and a plurality of test bit rows provided along bit lines of the memory cell part and/or a plurality of test word rows provided along word lines of the memory cell part. At least one of the rows of the test bit and/or test word rows is written-in with a write-in ratio different than those of the other test bit and/or test word rows.

40 Claims, 25 Drawing Figures

FIG. 7
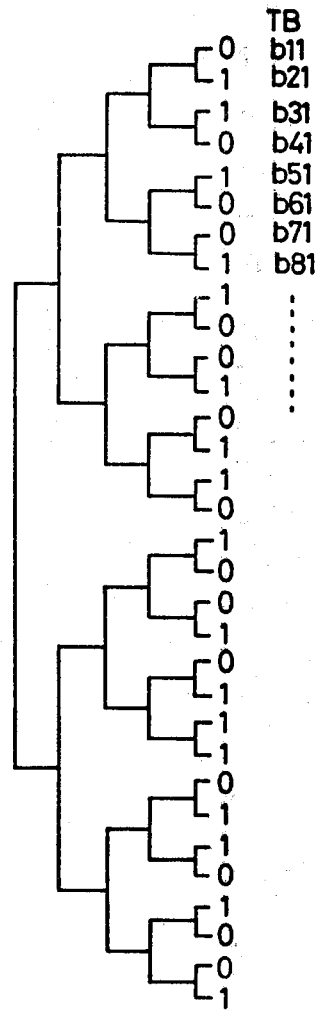
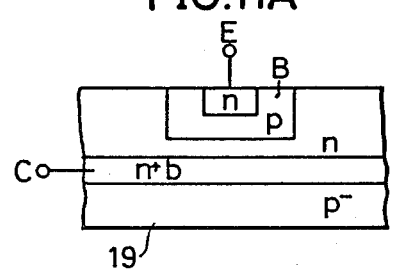
FIG. 11A
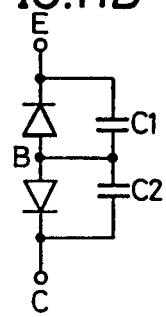
FIG. 11B

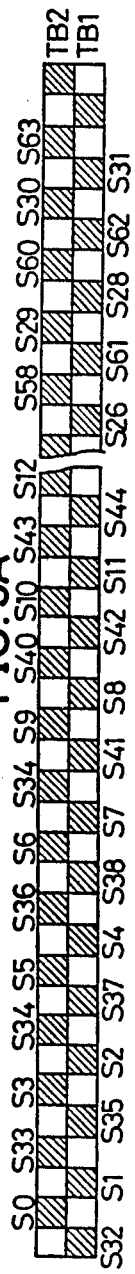
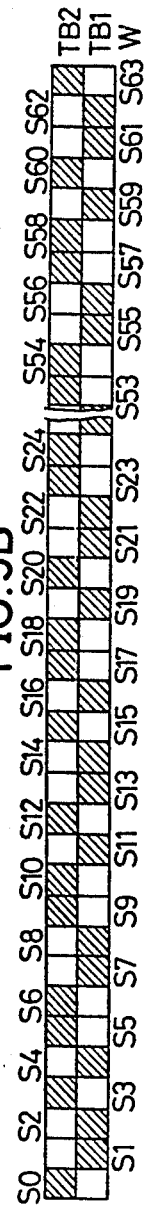
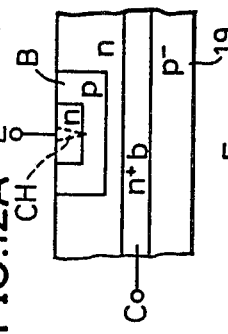
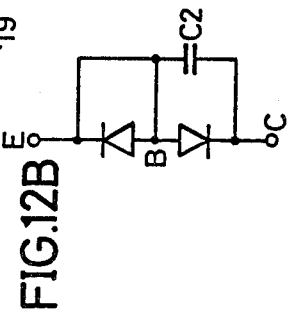
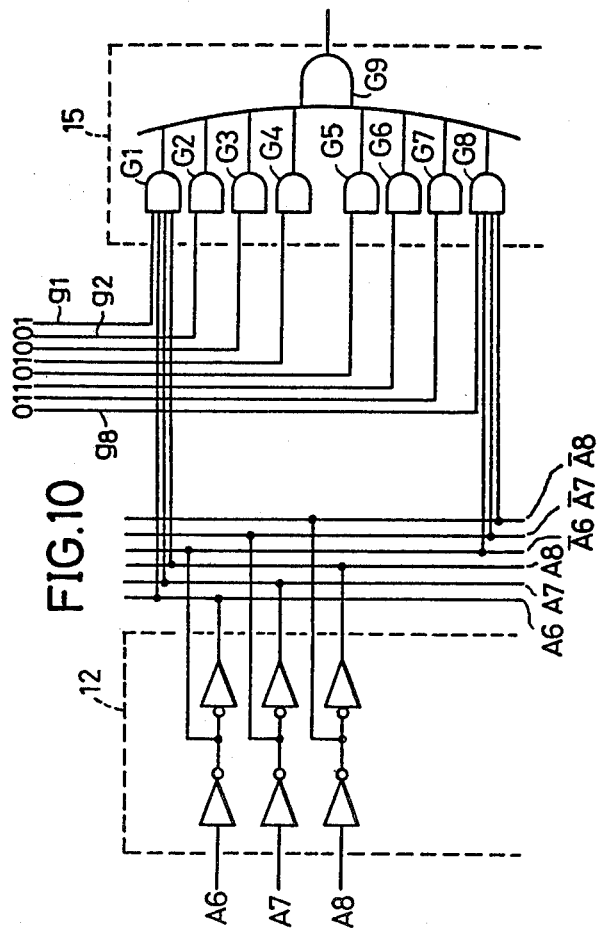

FIELD PROGRAMMABLE DEVICE WITH INTERNAL DYNAMIC TEST CIRCUIT

BACKGROUND OF THE INVENTION

The present invention relates generally to field programmable devices, and more particularly to a field programmable device, such as a ROM (Read Only Memory), PROM (Programmable Read Only Memory), FPLA (Field Programmable Logic Array) and the like, capable of being functionally tested before information is written in the device.

In a field programmable device such as a PROM or ROM, that is, a memory device capable of having information written into it in the field, all memory cells within the memory device, before the write-in of information, are in a "0" logic low or a "1" logic high state. Therefore, tests cannot be performed to detect whether a selected memory cell is in a normal or abnormal state.

An example of a conventional memory device of the above type comprises X and Y address inverters a X-decoder driver, a Y-decoder, a memory cell part, a multiplexer, and an output circuit. However, when all the memory cells of the memory cell part are in the same state, even upon breakdown of one or more peripheral circuits, for example, address inverters, decoder driver, or output circuit, the data read-out of the memory cells is all the same. Accordingly, it is impossible to know whether the cells are in normal or abnormal states. Even assuming that there are abnormalities, it is not possible to know where the abnormalities exist.

Hence, a system was devised in which a row of extra test bits and a test word are provided within the memory cell part. In this system, by storing predetermined code patterns, for example "1,0,1,0, ... ", into the test bit row and test word, the peripheral circuits can be tested by reading these code patterns. But, since there are many items within the memory device to be tested, the above system is insufficient because it can only perform some of the required tests. Therefore, more than simply providing a test bit row and a test word within the memory cell part, and writing a code patterns such as "1,0,1,0, ... ", is required an inventive code pattern must be devised. But, even the inventive code pattern is insufficient for performing the necessary tests since it sometimes cannot detect short-circuits in the wiring.

In view of the above problems, the applicants have proposed a field programmable device in the U.S. Pat. No. 4,312,067 issued to Shurasaka entitled "A FIELD PROGRAMMABLE DEVICE", filed on Nov. 19, 1979, which can be subjected to various tests, and accordingly capable of being tested before shipment. However, it has been discovered that this system is incapable of completely testing the operational speed of the memory device. This is because the capacitance of a memory cell in the field programmable device is different before information is written into the device than after information is written into the device. Accordingly, the word line capacitance varies with respect to the write-in ratio.

The time to read data out of the device, and the word line rise time vary in accordance with the above capacitance. These changes are not considerable, but since field programmable devices, especially the high-speed devices such as a Schottky-type PROM have a fast average access time of 20 nses in the 4-kilobit devices, even the slightest change becomes a problem.

The word line capacity is affected by the manufacturing process, and thus computation of the word line capacity is difficult, and is preferably obtained by actual measurements.

In the applicants' above-mentioned previously proposed field programmable device, the write-in ratio of both the test bit row and of the test word is 50%, hence capable of being subjected to a speed check of a 50% write-in ratio, but incapable of performing speed checks in the remaining parts. Therefore, when the user performs a 100% write-in (this is done quite often), the access time can become much higher than that of the nominal value.

SUMMARY OF THE INVENTION

A general object of the present invention is to provide a novel and useful field programmable device in which the above described problems have been overcome.

Another and more specific object of the present invention is to provide a field programmable device in which a plurality of test bit rows are provided along bit lines and/or a plurality of test word rows are provided along word lines in a memory cell part, so that at least one of the above rows has a differing write-in ratio from that of the other rows. According, with the present invention it is possible to completely test the DC and AC characteristics of the field programmable device before the shipment of the device.

Further objects and features of the present invention will be apparent from the following detailed description and accompanying drawings.

BRIEF DESCRIPTION OF THE DRAWINGS

FIG. 7 is a diagram showing the information to be written into the test bits for performing the DC test;

FIGS. 8A, 8B, 9A, and 9B are diagrams illustrating the actual test bit arrangement for performing the DC test;

FIG. 10 is a circuit diagram of a multiplexer test circuit;

FIGS. 11A, 11B, and 12A, 12B are, respectively, simplified cross-sectional diagrams of a cell and its equivalent circuit diagrams;

DETAILED DESCRIPTION OF THE PREFERRED EMBODIMENTS

Before describing the present invention, the field programmable device previously proposed by the same applicants in the U.S. patent application Ser. No. 95,782, is described, in order to more easily understand the details of the present invention.

Figure 1:
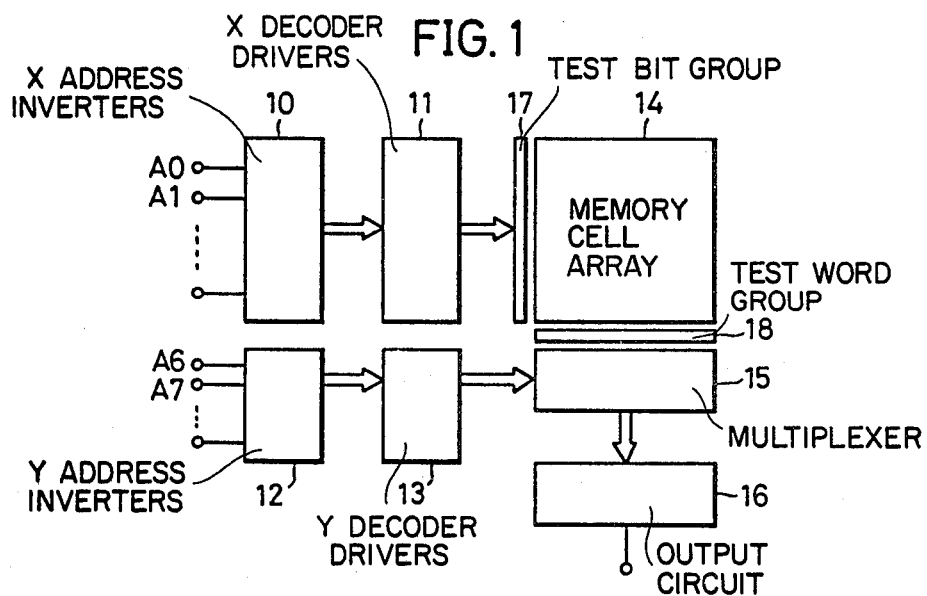
FIG. 1 is a block diagram of the construction of a PROM device embodying the present invention.

FIG. 1 is an example of the construction of a PROM device of the previously proposed system, which comprises X and Y address inverters 10 and 12, an X-decoder driver 11, a Y-decoder 13, a memory cell part 14, a multiplexer 15, an output circuit 16, and test bit and test word groups 17 and 18.

Figure 2:
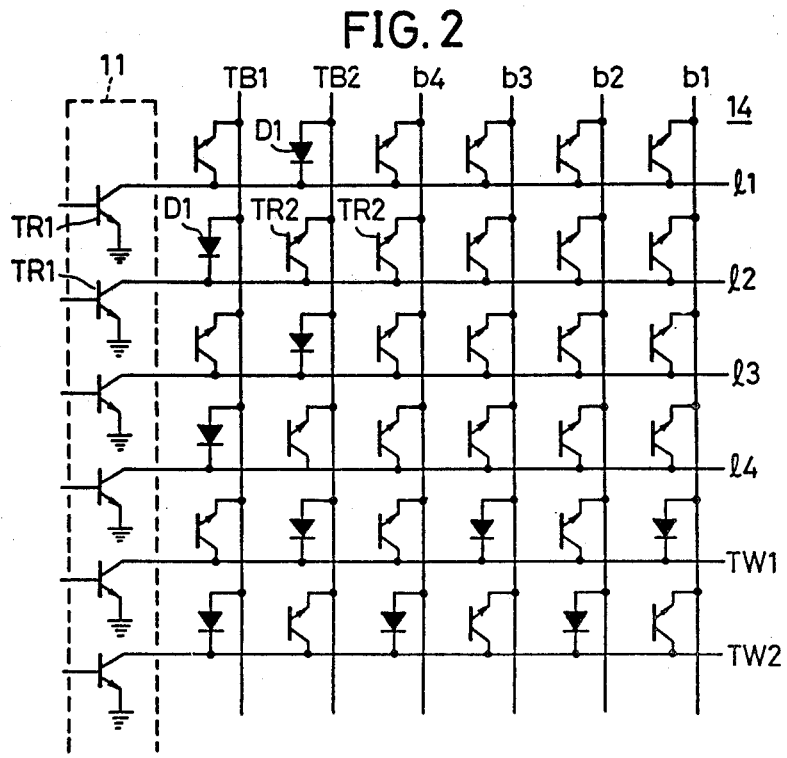
FIG. 2 is an equivalent circuit diagram of a pn-junction type memory cell part having test bit and test word rows.

FIG. 2 is an equivalent circuit diagram of a memory cell part of the above proposed system. Within memory cell part 14, as shown in FIG. 2, two test bit rows $TB_1$ and $TB_2$ are provided parallel to lines $b_1$ through $b_4$, and two test word rows $TW_1$ and $TW_2$ are provided parallel to lines $l_1$ through $l_4$. A predetermined code pattern, "0,1,1,0,1,0,0,1,...", is written into the first test bit row $TB_1$. The above code pattern is obtained by setting address signal bit $A_0$ of the address signal to a logic high level "1", then forming a code beginning with $\overline{A}_0 A_0$, concatenated with an inverted code $A_0 \overline{A}_0$ yielding a code $\overline{A}_0 A_0 A_0 \overline{A}_0$, which is then concatenated with an inverted code $A_0 \overline{A}_0 \overline{A}_0 A_0$ yielding a code $\overline{A}_0 A_0 A_0 \overline{A}_0 A_0 \overline{A}_0 \overline{A}_0 A_0$ and so on. The inversion of the code patterns written into the first test bit row $TB_1$ is written into the second test bit row $TB_2$. Similarly, predetermined code patterns are written into both the test word rows $TW_1$ and $TW_2$. Therefore, the states of corresponding test bit positions of the test bit rows $TB_1$ and $TB_2$ are complementary. The same is true for the test word rows $TW_1$ and $TW_2$.

Transistors $TR_1$ are transistors to the output stages of a decoder driver 11, and are connected to corresponding word lines $l_1, l_2, \ldots$. Transistors $TR_2$ represent memory cells not yet written into. Diodes $D_1$ represent diodes which short-circuit the emitter and base junctions, to show memory cells written-in with information "1" indicated by a logic high level.

Figure 3A:
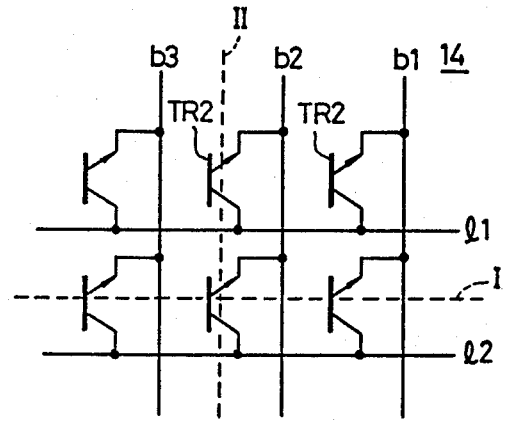
FIGS. 3A through 3C are respectively, equivalent circuit diagram and cross-sectional diagrams of a memory cell part in the unprogrammed state.
Figure 3B:
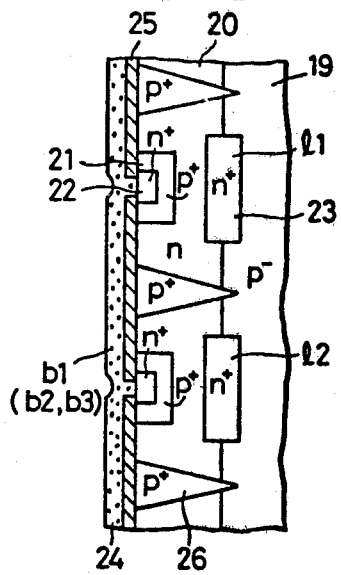
Figure 3C:
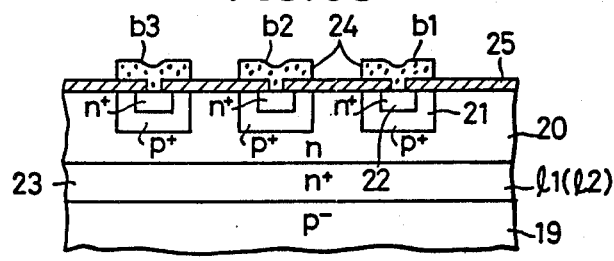

FIGS. 3A through 3C are an equivalent circuit diagram of the memory cell part not yet written into, the respective cross-sectional diagrams of the memory cell part out, respectively along dotted lines I and II of FIG. 3A. In this semiconductor device, an n-type semiconductor layer 20, which is to be the collector, is epitaxially grown on a $p^-$-type silicon semiconductor base 19. A plurality of $p^+$-type regions 21 that are to be the bases, are formed in the n-type semiconductor layer 20, and $n^+$-type regions 22 are formed in the $p^+$-type regions 21. The word lines $l_1$ and $l_2$ formed by the $n^+$-type region 23 are embedded below the n-type layer 20, while the bit lines $b_1$ through $b_3$ are constructed of metal wirings 24 formed on the surface of the bit lines $b_1$ through $b_3$. Layer 25 is an insulating layer, and $p^+$-type isolation regions 26 separate each of the word lines.

Figure 4:
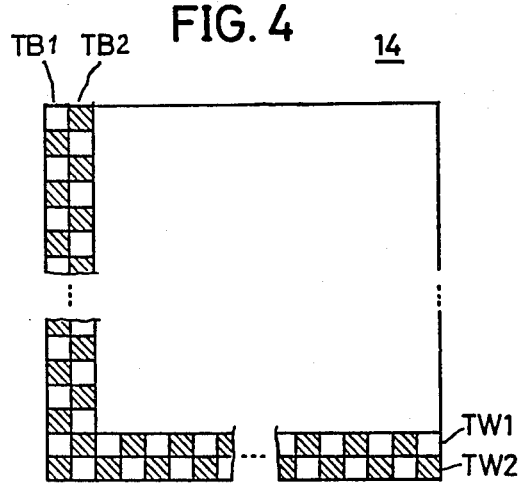
FIG. 4 is a diagram of a memory cell part, showing the programming state of a memory cell part according to FIG. 2.

FIG. 4 illustrates the memory cell part shown in FIG. 2. In FIG. 4, none of the memory cells of the memory cell part 14 have information written therein, but information is written selectively in the test bits and the test words. The cells in which information is written, are shown by the cross-hatched squares, the remaining cells are shown by unmarked squares.

The reason why it is necessary to selectively write the information "0" and "1" into the test bit rows and test word rows is explained below. The memory cells are selected by Y-address inverter 12, Y-decoder 13, and multiplexer 15 along the bit line, and by X-address inverter 10, X-decoder driver 11 along the word line. However, to simplify the description only the selection along the word line will be described with reference to FIGS. 5 and 6, which showing the outlines of the word line side.

Figure 5:
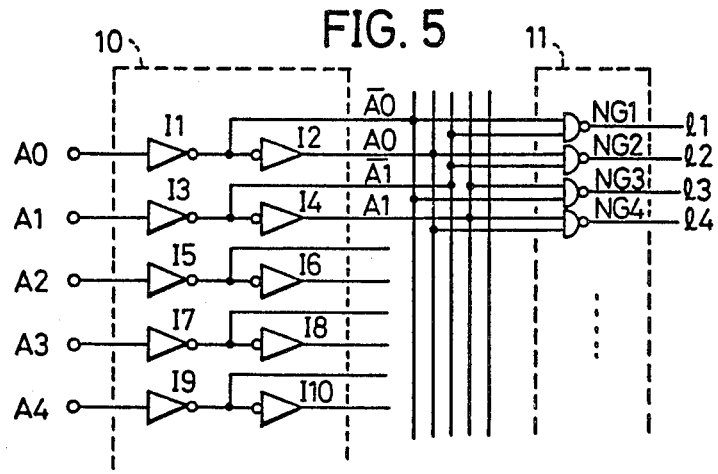
FIGS. 5 and 6 are circuit diagrams showing the construction of the address inverters, decoder driver, and memory cell part of the PROM device of FIG. 1.

As shown in FIG. 5, address inverter 10 comprises a plurality of rows each with two inverters connected in series, namely, $I_1$ and $I_2$, $I_3$ and $I_4$, and so on. Decoder driver 11 comprises a plurality of parallel connected NAND-gates, namely, $NG_1$, $NG_2$, and so on. The address signal bits $A_0, A_1, A_2 \ldots$ of the address signal are respectively and correspondingly applied to the input terminals of the plurality of two series connected inverters. Accordingly, the inverted and non-inverted signals, namely, $\overline{A}_0, A_0, \overline{A}_1, A_1, \ldots$ are generated.

In this example, the inputs of NAND-gate $NG_1$ are $\overline{A}_0$ and $\overline{A}_1$, and the output of $NG_1$ is when $A_0 = A_1 = 0$, which means that the word line $l_1$ has been selected. On the other hand, the inputs of NAND-gate $NG_2$ are $\overline{A}_0$ and $A_1$, and the output of $NG_2$ is a logic low level "0" when $A_0 = 1$, and $A_1 = 0$, which means that the word line $l_2$ has been selected. Similarly, the NAND-gates $NG_3$ and $NG_4$ respectively generate logic low level outputs when $A_0 = 0$ and $A_1 = 1$, and $A_0 = A_1 = 1$, and respectively select the word lines $l_3$ and $l_4$. A decoder driver for address signal bits $A_0$ and $A_1$ is shown in this example by which one of four word lines is selected by the two bits. However, if the address signal has five address signal bits, namely $A_0$ through $A_4$, then it is possible to select one from $2^5$, or 32 word lines. But, ten inverters, $I_1$ through $I_{10}$, and 32 NAND-gates are required.

Figure 6:
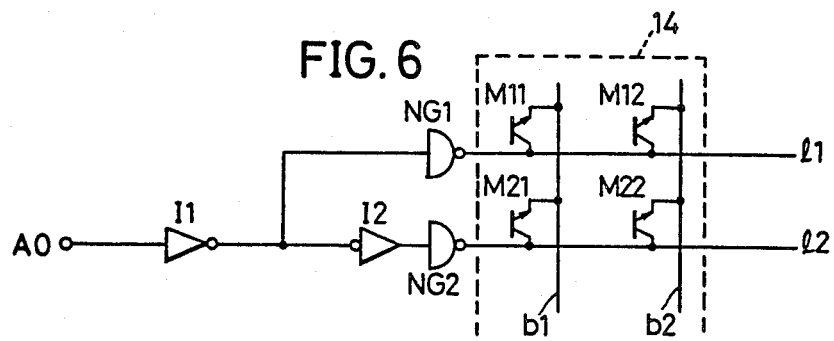

FIG. 6 shows a word line side selection system, and a portion of the memory cell part 14. In FIG. 6, memory cells $M_{11}, M_{12}, \ldots M_{21}, M_{22}, \ldots$ are respectively located at the intersection points of the word lines $l_1, l_2, \ldots$ and bit lines $b_1, b_2, \ldots$. To simplify the diagram, only address signal bit $A_0$ of the address signal is shown. Generally, the memory cells of a PROM are constructed of fuses or p-n junctions. But, in this example, the latter is used and the writing of information is performed by destroying the base emitter junction of an npn-transistor. Accordingly, when this junction is destroyed, a current flows toward the NAND-gate through the bit and word lines when the output of the NAND-gate is a logic low-level. On the other hand, when this junction is not destroyed, the above current does not flow. Therefore a destroyed junction indicates a write-in of the information "1", and an intact junction indicates a write-in of the information "0".

In PROM devices, the write-in of information is performed by the user, and is not performed before shipment. Therefore, because of the write-in of information is not performed, current does not flow toward the NAND-gate through the bit and word lines when the output of the NAND-gate is a logic low level. Accordingly, it is impossible to detect whether or not a word line has been selected or a defect such as a break in the wiring exists. Also, since a word line is selected only when the address inverters, decoder driver, and the wiring thereof, are normal, if a word line is not selected because of abnormalites, it is impossible to detect the location of the defect.

Test bits can be provided in the memory cell part to overcome the above problem. If the memory cells $M_{11}$, $M_{12}, \ldots$ of FIG. 6 are test bits inserted in the additional bit line of the memory cell part, and a code "1,0,1,0, . . .", is written into these test bits, then a current flows and the line $l_1$ is selected when address signal bit $A_0$ is "0", and a current flows and line $l_2$ is selected when address signal bit $A_0$ is "1". Therefore, inverter $I_1$, NAND-gate $NG_1$ and the wiring thereof can be assumed to be normal. Abnormalities are not detected in inverter $I_2$ and NAND-gate $NG_2$, when both inverter $I_2$ and NAND-gate $NG_2$ are in the abnormal states. That is, in when the output of inverter $I_2$ constantly produces low-level output and the output of NAND-gate $NG_2$ is at a constant high-level, or when there is a break in the wiring. Abnormalities are not detected because no current flows in either of these cases. Therefore it cannot be concluded from the above test alone that the inverter $I_2$ and NAND-gate $NG_2$ system is in a normal state.

Accordingly, the combination of the output states of each of the elements shown in FIG. 6 must be considered. The three possible output states of the inverter are a normal state, an abnormal state in which the output is always "1" (hereinafter referred to as fixed "1" state), and an abnormal state in which its output is always "0" (hereinafter referred to as fixed "0" state). Therefore, when two inverters are connected in series, there are "3×3=9" possible output states. However, the resultant output state is the same when inverter $I_1$ is in a fixed "1" state and inverter $I_2$ is in a normal state, or when inverter $I_1$ is in a fixed "1" state and inverter $I_2$ is in a fixed "0" state. Similarly the resultant output is same when inverter $I_1$ is in a fixed "0" state and inverter $I_2$ is in a normal state, when inverter $I_1$ is in a fixed "0" state and inverter $I_2$ is in a fixed "1" state. Hence there are seven possible output state combinations, as shown in Table 1.

TABLE 1

| Case No. | Input | State of inverter $I_1$ | State of inverter $I_2$ | Output of inverter $I_1$ | Output of inverter $I_2$ | Selection State |
|---|---|---|---|---|---|---|
| (1) | 1 | normal | normal | 0 | 1 | normal |
|  | 0 |  |  | 1 | 0 |  |
| (2) | 1 | normal | fixed "1" | 0 | 1 | mixed |
|  | 0 |  |  | 1 | 1 |  |
| (3) | 1 | normal | fixed "0" | 0 | 0 | mixed |
|  | 0 |  |  | 1 | 0 |  |
| (4) | 1 | fixed "1" | normal | 1 | 0 | fixed |
|  | 0 |  |  | 1 | 0 |  |
|  | 1 | fixed "1" | fixed "0" | 1 | 0 | fixed |
|  | 0 |  |  | 1 | 0 |  |
| (5) | 1 | fixed "1" | fixed "1" | 1 | 1 | multi-plexed |
|  | 0 |  |  | 1 | 1 |  |
| (6) | 1 | fixed "0" | normal | 0 | 1 | fixed |
|  | 0 |  |  | 0 | 1 |  |
|  | 1 | fixed "0" | fixed "1" | 0 | 1 | fixed |
|  | 0 |  |  | 0 | 1 |  |
| (7) | 1 | fixed "0" | fixed "0" | 0 | 0 | non-selection |
|  | 0 |  |  | 0 | 0 |  |

Of the cases (1) through (7) in Table 1, the only normal state is case (1), and all other cases (2) through (7) are abnormal states (cases (2) and (3) are partially normal and partially abnormal, and thus abnormal when considered as a whole). The object is to detect the above abnormal cases by use of the test bits, but differences occur according to the contents stored in the test bits, as shown in Table 2.

TABLE 2

| Input $A_0$ | Selected wire | Test Bit | (1) | (2) | (3) | (4) | (5) | (6) | (7) | code |
|---|---|---|---|---|---|---|---|---|---|---|
| 0 | $l_1$ | $M_{11} = 1$ | 1 | 1 | 1 | 1 | 1 | 0 | 0 | (I) |

TABLE 2-continued

| Input $A_0$ | Selected wire | Test Bit | (1) | (2) | (3) | (4) | (5) | (6) | (7) | code |
|---|---|---|---|---|---|---|---|---|---|---|
| 1 | $l_2$ | $M_{21} = 0$ | 0 | 0 | 0 | 1 | 1 | 0 | 0 |  |
|  | Conclusion |  | o | o | o | x | x | x | x |  |
| 0 | $l_1$ | $M_{11} = 0$ | 0 | 1 | 0 | 0 | 1 | 1 | 0 | (II) |
| 1 | $l_2$ | $M_{21} = 1$ | 1 | 1 | 0 | 0 | 1 | 1 | 0 |  |
|  | Conclusion |  | o | x | x | x | x | x | x |  |

As seen in code (I) of table 2, when information "1" and "0" in is written into memory cells $M_{11}$ and $M_{21}$ respectively of the test bit $b_1$ on normal selection, case (1), memory cell $M_{11}$ is conductive when the input address signal, $A_0$, is "0" and line $l_1$ is selected. Memory cell $M_{21}$ is not conductive when the input address signal $A_0$ is "1" and the line $l_2$ is selected. Accordingly, the read-out values of the test bit memory cells $M_{11}$ and $M_{21}$ are "1" and "0", respectively, the same as those values written therein. Hence, this case can be judged as normal.

However, in mixed selection for example, when inverter $I_1$ in a normal state and inverter $I_2$ is in a fixed "1" state as in case (2), when information "1" and "0" is written into memory cells $M_{11}$ and $M_{21}$ respectively and the input address signal $A_0$ is "0" selecting line $l_1$ memory cell $M_{11}$ conducts. When the input address signal $A_0$ is "1" and the line $l_2$ is selected, the memory cell $M_{21}$ does not conduct. Therefore, the read-out contents corresponds to the written-in contents. but this case should be judged as being in error, since the inverter $I_2$ is in an abnormal state, namely, in a fixed "1" state. Therefore, the abnormality in case (2) cannot be detected by this arrangement of test bit code. The same is true for the case (3) because the abnormality in the inverter $I_2$ cannot be detected by the coding of code (I).

On the contrary, when information "0" and "1" code (II) of Table 2, is written into memory cells $M_{11}$ and $M_{21}$, respectively, of the test bit line $b_1$, the contents written-in and read-out of the above respective memory cells are the same when operating in the normal selection state, case (1). In the mixed selection state, case (2), there is no current passing through memory cell $M_{11}$ when the input address signal $A_0$ is "0" and line $l_f$ is selected since the memory cell $M_{11}$ (transistor) is not conductive; however, because inverter $I_2$ is in a fixed "1" state and the line $l_2$ is also selected, current flows through the memory cell $M_{21}$, and the resultant read-out content of the memory cell $M_{11}$ is "1". When the input address signal $A_0$ is "1" and the line $l_2$ is selected, there is a current flowing through the memory cell $M_{21}$, and thus the read-out signal of the memory cell $M_{21}$ becomes "1". Accordingly, the read-out contents "1, 1" differs from the written-in contents "0, 1", and the conclusion is that an abnormality exists. This conclusion, is, of course, correct.

Similarly, correct conclusions can be made for each case (1) through (7), of code (II) of Table 2. Therefore, the write-in contents for the memory cells $M_{11}$ and $M_{21}$ should be $M_{11} = 0$ and $M_{21} = 1$, and the other combination is unacceptable. The above description is for the case when the address signal has only one bit, namely $A_0$. When there are a plurality of bits, for example, five bits, the coding is as shown in FIG. 7.

FIG. 7 shows that test bits $b_{11}$ and $b_{21}$, corresponding to the above memory cells $M_{11}$ and $M_{21}$, are respectively "0" and "1" as described above, and that succeeding test bits $b_{31}$ and $b_{41}$ should contain the inverse code of that formed by the test bits $b_{11}$ and $b_{21}$, namely, "1" and "0", respectively. Succeeding test bits $b_{51}$, $b_{61}$, $b_{71}$, and $b_{81}$ should contain the inverse code of that formed by the test bits $b_{11}$, $b_{21}$, $b_{31}$, and $b_{41}$, namely, "1,0,0,1". Similarly, the rest of the code can be obtained as shown in FIG. 7, and the same code pattern should be inserted into the test word $TW_1$ to obtain the above described valid test results.

By writing the above described information (code) into the test bits, the address inverters and the decoder driver can be tested for their normal and abnormal state. However, only the current absorbing capacity of the decoder driver connected to the bits written-in with the information "1", that is, only the current absorbing capacity of half the decoder drivers can be checked, since the other half of the decoders are connected to bits containing the information "0" (This is because the code pattern contains the same number of "0s" and "1s").

The write-in of information is performed by selecting a word line, and applying a large voltage to the bit line so that a large current of about 200 mA flows through the bit line, memory cell, word line, and NAND-gate. However, this large current cannot be passed through to the NAND-gates connected to the OFF state test bits, and the current absorbing capacity of these NAND-gates cannot be checked. The object of the invention disclosed in the U.S. Pat. No. 4,312,067 issued to Shirosaka is to compensate for the above described problems. As seen in FIGS. 2 through 4, an additional bit line and word line are provided and a test bit $TB_2$ and test word $TW_2$ are connected to these additional lines. Furthermore, the information written-in these test bit cells are the inverse of those written-in the first test bit line and first test word line, namely, "1,0,0,1,0, ... ".

When the code "0,1,1,0,1,0,0,1,1,0, ... "shown in FIG. 7, is written-in the test bit lines, the second and third, and sixth and seventh test bit positions, ... , have the same contents. Accordingly, the above test is the same even if there is a short-circuit in the wiring between the mentioned bit pairs. The short-circuit in cannot be detected. Thus, in the above proposed device, the contents written-in the test bits are the same, but the geographical test bit arrangement in the memory cell part is changed so that the stored contents is the inverse of the neighboring test bits, namely, "0,1,0,1,0,1 ... " or "1,0,1,0,1, ... ".

Figure 8A:
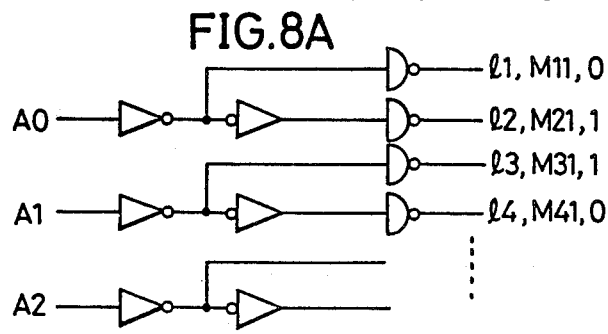
Figure 8B:
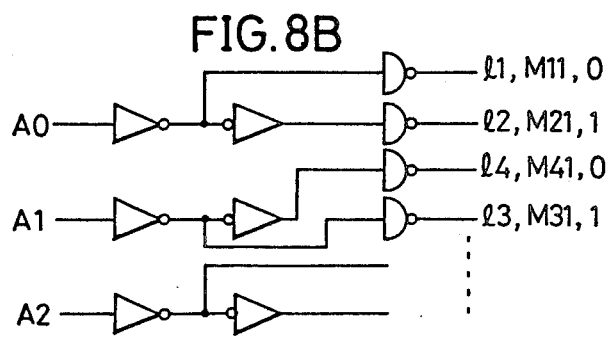

FIGS. 8A and 8B show the above described test bit arrangement for a two-bit address signal and four word lines. FIG. 8A shows the case where the code "0,1,1,0" is stored in the test bits, and FIG. 8B shows a case where the code "0,1,0,1," is stored in the test bits. In either of the above cases, the test bits $b_{11}$, $b_{21}$, $b_{31}$, and $b_{41}$ selected by the two-bit address signals "00", "01", "10", and "11" are written-in with the information "0,1,1,0", respectively, but the geographical arrangement of the bits in the memory cell part in the case shown by FIG. 8B is "0,1,0,1". Accordingly, with the arrangement shown in FIG. 8B, a different result is obtained when a short-circuit exists in adjacent wires of the word line than that when in the normal state, and the abnormality can be detected immediately.

FIGS. 9A and 9B respectively show test bit arrangements for a six-bit address signal and sixty-four memory cells. FIG. 9A shows a test bit arrangement considering a counter-measure against short-circuits in the wiring, while the arrangement of FIG. 9B does not. The cross-hatched squares (bits) indicate bits containing the information "1", and the unmarked squares (bits) indicate bits containing the information "0". In the arrangement of FIG. 9A, besides arranging the bits so that the contents of neighboring bits are inverted, that is, the neighboring bits of a bit containing "0" contain "1" and vice versa, the position of the test bits are arranged so that their addresses are arranged in an order S32, S0, S1, S33, S35, . . . .

A detection circuit for detecting the defect in the multiplexer is shown in FIG. 10. When a memory's capacity is large, memory cell part 14 of FIG. 1 is divided into a plurality of memory cell groups. Each memory cell group is selectively connected to output circuit 16 by use of multiplexer 15 connected between the output circuit 16 and the memory cell groups. However, this multiplexer 15 must also be tested to determine whether or not it is operating normally. To perform this test, a test word is provided which generates an output representing the output of each of the memory cell groups, and an output is obtained by switching over these outputs by a switching signal.

In FIG. 10, AND-gates $G_1$ through $G_8$, and OR-gate $G_9$ from multiplexer 15. Output circuits of each of the memory cell groups are designated by $g_1$ through $g_8$, and selection signals bits for selecting the AND-gates $G_1$ through $G_8$ are designated by $A_6$ through $A_8$. In this example, there are eight memory cell groups, that is, there are eight AND-gates. The output of one of the AND-gates is selected to be high ("1") by the selection signal formed by the three selection signal bits $A_6$ through $A_8$. The abnormalities can be checked by setting the test word to contain "0,1,1,0,1,0,0,1,", and considering a possibility of breaks in the wiring, it is desirable to set the arrangement of the test word row to contain "0,1,0,1, ... ".

Normal or abnormal operating states can be determined in the above cases (1) through (7), a test of the current absorbing capability of the decoder driver, and a check for short-circuits in the wiring can be performed in the improved field programmable device described above practically a complete set of tests can be performed on the field programmable device in its manufacturing stage before its shipment. Moreover, the test word and the test bit are used in a similar manner, enabling DC tests on the output voltage and output short current, as well as AC tests. Therefore the write-in current absorption, multiplexer system, and output voltages can be tested for normal operation.

However, these AC and DC tests of the peripheral circuits of the memory device, are sufficient only for PROMs and the like having relatively slow operational speeds. In high-speed devices, such as the high-speed Schottky-type PROM, the average access time is fast, namely in the 20 ns range for the 4-kilobit devices. Accordingly, the AC characteristic of the peripheral circuits within the memory cannot be fully guaranteed by just providing test words or test bits having a 50% write-in ratio that is, there are same number of "0s" and "1s" written into the test words or test bits.

A memory cell having no information written-in, is shown by FIGS. 11A and 11B, where FIG. 11B is an equivalent circuit diagram of the memory cell shown in FIG. 11A. A memory cell having information written-in, is shown by FIGS. 12A and 12B, where FIG. 12B is an equivalent circuit diagram of the memory cell shown in FIG. 12B. The memory cell of FIG. 11A has a junction capacitance $C_1$ between the emitter E and base B when reverse-biased, and a junction capacitance $C_2$ between the base B and collector C when forward-biased. These capabilities, are connected in series. The memory cell having information written-in, FIGS. 12A, 12B, only capacitance $C_2$ since a conductive channel CH is formed between the emitter E and base B by destroying the emitter-base junction as shown in FIG. 12A. The junction capacitance $C_2$ between the base B and collector C becomes significant when the base B and collector C junction is forward-biased, and therefore, usually does not introduce a problem. However, this capacitance does introduce a problem in this case for the following reasons.

When the emitter-base junction is short-circuited, a pnp-type transistor is formed by the base B, collector C (the collector region n and the buried layer n+b), and the base plate 19. A current flows through this pnp-type transistor upon selection, as can be clearly seen from the diagram of FIG. 12A. Hence, when the word line is non-selected, the base current of pnp-type transistor is cut-off, and the pnp-type transistor accordingly is turned OFF. However, a charge due to the current which had been flowing remains, and thus, until this charge dissipates, the word line voltage does not rise to the high ("1") level of non-selection.

Capacitance $C_2$ is much larger than the capacitance of a non-written cell which is approximately equal to the capacitance $C_1$. Accordingly, the word line or bit line capacitance may become larger than that when test bits $TB_1$ and $TB_2$ or test words $TW_1$ and $TW_2$ having a 50% write-in ratio are selected. That is, in a pn-junction type PROM, the word line or bit line having a 100% write-in ratio has the highest capacitance, hence the heaviest load. Therefore, when the AC characteristic of the memory device including its internal peripheral circuits is not tested under such a condition before its shipment, the access time of the memory device under maximum load cannot be guaranteed.

Figure 13:
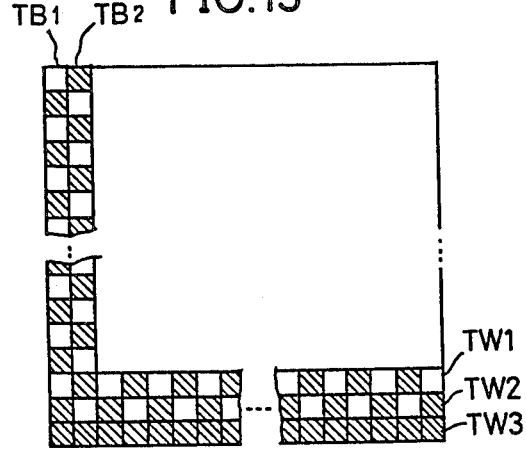
FIG. 13 illustrates an embodiment of a memory device of the present invention.

A sectional diagram of a memory cell part of an embodiment of a field programmable device of the present invention is shown in FIG. 13. The embodiment shown in FIG. 13 differs from that shown in FIG. 4, in that, in FIG. 13, a third test word $TW_3$ having a write-in ratio of 100% has been added (the cross-hatched squares represent the written-in bits). The test word $TW_3$ is, for example, formed by short-circuiting the emitter-base junctions of all memory cells in word line $l_4$ shown in FIG. 2, thus converting them into the equivalent of diodes $D_1$.

Figure 14A:
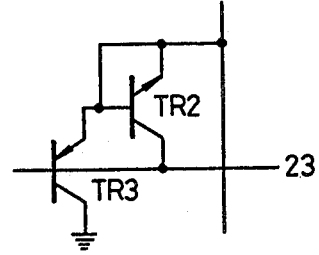
FIGS. 14A, 14B, 15A, 15B, 16A, and 16B are, respectively, equivalent circuit diagrams and cross-sectional diagrams showing different types of memory cells.
Figure 14B:
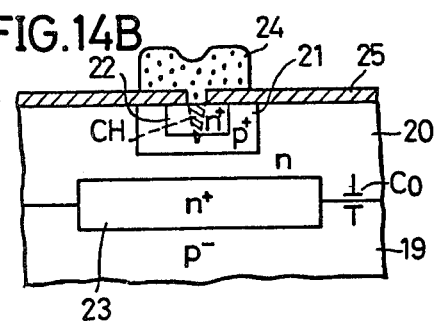

FIG. 14A shows a more detailed equivalent circuit diagram of the above memory cell, and FIG. 14B shows a cross-sectional diagram of the memory cell. In FIG. 14B, those parts that are the same as the corresponding parts in FIGS. 3A and 3B are designated by like reference numbers. As described in conjunction with FIGS. 3B and 3C, a pnp-type transistor (transistor $TR_3$ of FIG. 14A) having the $p^-$-type semiconductor substrate 19, is parasitically formed. Accordingly, a junction capacitance $C_0$ (capacitance $C_0$ is larger than the above described capacitance $C_1$) is formed between the n-type semiconductor layer 20 and the $p^-$-type semiconductor substrate 19 in the reverse-biased state and this capacitance $C_0$ acts as a load after the conducting channel CH is formed. Hence, the capacitance of the written-in cells is larger than that of the non-written cells, and the load seen from the peripheral circuit side differs according to the write-in ratio. Therefore, in the present embodiment, a test word line $TW_3$ having a maximum load is provided, to guarantee the AC characteristics or the access time of the field programmable device being shipped, by forcing the slowest access time when the test is performed with the additional test word $TW_3$ selected. Test words $TW_1$ and $TW_2$ are also provided, of course, and thus the DC characteristics on the word line side is also fully guranteed. The same is true on the bit line side, but it is a repetitive description of the above, and is omitted. The test cells for measuring the access time of the memory device can be provided on the test bit side, test word side, or on both the test word and test bit sides.

Moreover, as long as the load is heavy enough to practically guarantee the AC characteristic of the device, the code pattern written-in to the test word $TW_3$ does not necessarily have to be of a 100% write-in ratio, that is, some bits may be non-written cells. Furthermore, it is also possible to assume the slowest access time, by providing two rows of test bits or test words having different write-in ratios between 0% and 100%, and measuring their access time. In this case, one of the test bit ot test word rows for performing the DC test can be used as the above test bit and test word rows. Moreover, according to the type of memory device being used, it is necessary in some cases to set the code pattern of the test word $TW_3$ to a pattern in which the bits (cells) are all zeros, or close to all zeros.

Figure 15A:
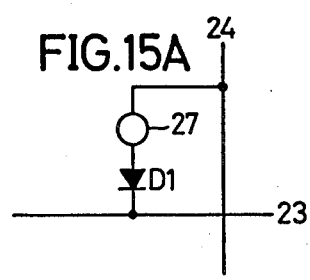
Figure 15B:
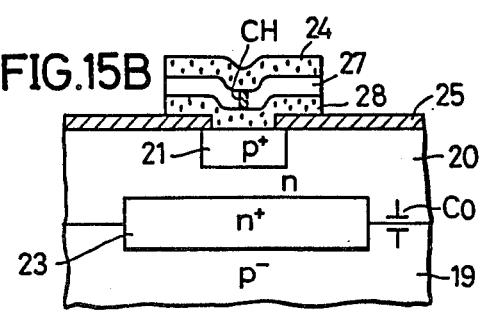
Figure 16A:
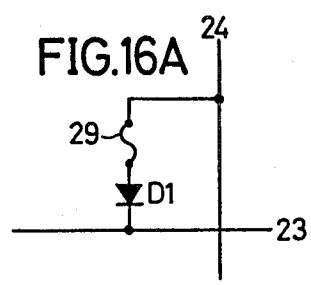
Figure 16B:
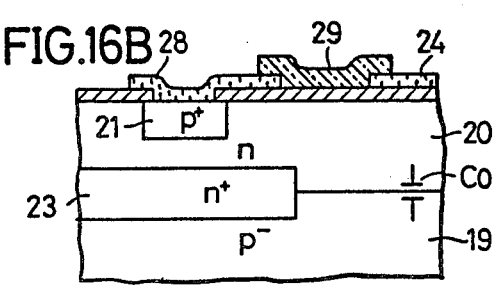

FIGS. 15A and 15B show a ROM (or EAROM) having memory cells made out of amorphous semiconductor (chalcogenied glass). In this case, the cells are in "1" states as in the pn-junction type, but in the case of a fuse type device, the memories must all contain the reverse of the above, namely "0s", as shown in FIGS. 16A and 16B. In FIGS. 15A and 16B, those parts that are the same as the corresponding parts in FIGS. 3A and 3B are designated by like reference numerals, and their description are omitted.

In the devices of FIGS. 15A and 15B, a chalcogenied glass layer 27 and a metal electrode 28 are inserted between the metal electrode (bit line) 24 and the anode 21 of diode $D_1$ to provide a bias voltage at the electrodes 24 and 28. By forming a conductive channel CH between these electrodes 24 and 28 by applying a bias current and transforming the single crystal into polycrystalline by use of Joule heat, the write-in is performed. Accordingly, this type of memory cell is the same as the pn-junction type cell. However, the cell shown in FIGS. 16A and 16B performs the write-in by flowing an overcurrent to melt and break a fuse 29. This is the opposite mechanism than that of the above two examples, and comprises a maximum capacitance in the word line (or bit line) having 100% non-written cells and the capacitance is minimum for the 100% written-in word line (or bit line ).

Further, this invention is not limited to these embodiments but various variations and modifications may be made without departing from the scope of the invention.

What is claimed is:
1. A field programmable device comprising:
   a memory cell array including memory cells;
   a plurality of bit lines operatively connected to corresponding ones of said memory cells;
   a plurality of word lines operatively connected to corresponding ones of said memory cells, and formed at angles with and intersecting said bit lines; and test rows respectively, operatively connected to one plurality of said plurality of word lines and said plurality of bit lines, each of said test rows comprising memory cells having a specified write-in ratio, one of said test rows having a write-in ratio different from said write-in ratio of each of the remainder of said test rows.

2. A field programmable device according to claim 1, wherein said test rows comprises a plurality of test bit rows provided along said plurality of bit lines.

3. A field programmable device according to claim 1, wherein said test rows comprises a plurality of test word rows provided along said plurality of word lines.

4. A field programmable device according to claim 1, wherein said test rows comprises a plurality of test bit rows provided along said plurality of bit lines, and a plurality of test word rows provided along said plurality of word lines.

5. A device according to claims 1, 2, 3, or 4, wherein a first row of said test rows comprises a predetermined code pattern having n bit positions.

6. A device according to claim 5, wherein a second test row of said test rows comprises a code pattern being the inversion of said code pattern of said first test row.

7. A device according to claim 6, wherein said specified write-in ratio of a third test row of said test rows is 100%.

8. A device according to claim 6, wherein said specified write-in ratio of a third test row of said test rows is 0%.

9. A device according to claim 5, wherein adjacent bit positions of said n bit positions of said predetermined code are the inverse of each other.

10. A device according to claim 9, wherein said specified write-in ratio of a second test row of said test rows is 0%.

11. A device according to claim 9, wherein a second test row of said test rows comprises a code pattern being the inversion of said code pattern of said first test row.

12. A device according to claim 11, wherein said specified write-in ratio of a third test row of said test rows is 100%.

13. A device according to claim 11, wherein said specified write-in ratio of a third test row of said test rows is 0%.

14. A device according to claim 9, wherein said specified write-in ratio of a second test row of said test rows is 100%.

15. A device according to claim 9, wherein said specified write-in ratio of a second test row of said test rows is 0%.

16. A device according to claim 9, wherein said specified write-in ratio of a second test row of said test rows is 100%.

17. A device according to claim 5, wherein said specified write-in ratio of a second test row of said test rows is 100%.

18. A device according to claim 5, wherein said specified write-in ratio of a second test row of said test rows is 0%.

19. A device according to claim 5, wherein said specified write-in ratio of a second test row of said test rows is 100%.

20. A device according to claim 5, wherein said specified write-in ratio of a second test row of said test rows is 0%.

21. A device according to claim 2, wherein the respective bit positions of said n bit positions of said predetermined code pattern having values determined in accordance with
   a first two bit positions of the n bit positions having respective values corresponding to a code $A_o$, $A_o$, with $A_o$ equal to a 1, and
   successive adjacent bit positions of the n bit positions having respective values corresponding to the values of the respective bit positions already determined, concatenated to the right of the inversion of the values of the bit positions of the n bit positions already determined.

22. A device according to claim 21, wherein said specified write-in ratio of a second test row of said test rows is 100%.

23. A device according to claim 21, wherein said specified write-in ratio of a second test row of said test rows is 0%.

24. A device according to claim 21, wherein said specified write-in ratio of a second test row of said test rows is 100%.

25. A device according to claim 21, wherein said specified write-in ratio of a second test row of said test rows is 0%.

26. A device according to claims 1, 2, 3, or 4, wherein said specified write-in ratio of at least one of said test rows is selected to be one of 100% or 0%.

27. A device according to claims 1, 2, 3, or 4, wherein said device further comprises:
   a first test row of said test rows comprising a predetermined code having n bit positions, such that adjacent bit positions are the inverse of each other;
   a second test row comprising a code pattern being the inverse of said predetermined code pattern of said first test row; and
   said specified write-in ratio of a third test row being 100%.

28. A device according to claims 1, 2, 3, or 4, wherein said device further comprises:
   a first test row of said test rows comprising a predetermined code pattern having n bit positions, such that adjacent bit positions are the inverse of each other;
   a second test row comprising a code pattern being the inverse of said predetermined code pattern of said first test row; and
   said specified write-in ratio of a third test row being 0%.

29. A field programmable device according to claims 1, 2, 3, or 4, wherein said memory cell part further comprises a plurality of p-n junction programmable memory devices correspondingly, operatively connected to said bit lines and to said word lines, respectively.

30. A device according to claim 29, wherein each of said plurality of p-n junction programmable memory devices comprises a p⁻ substrate, a collector region comprising an n+b buried layer formed on said substrate, an n layer formed on said n+b buried layer, a p base region formed on said n layer of said collector region, and an emitter n region formed in said p base region, said p-n junction programmable memory device thereby storing a 0.

31. A device according to claim 30, wherein each of said plurality of p-n junction programmable memory devices further comprises a conductive channel through said n emitter region to said p base portion, said p-n junction programmable memory device thereby storing a 1.

32. A device according to claim 29, wherein each of said plurality of p-n junction programmable memory devices comprises a p⁻ substrate, a collector region comprising an n layer formed on said p⁻ substrate and a buried n+ region formed at the junction of said p⁻ substrate and said buried n+ region, a p+ base region formed in said n layer, an n+ emitter region formed in said p+ base region, an insulating layer formed on said n layer, on said p+ base region, and on a portion of said emitter region, and a metal electrode formed on said insulating layer and on the remaining portion of said n+ emitter region, said p-n junction programmable memory device thereby storing a 0.

33. A device according to claim 32, wherein each of said plurality of p-n junction programmable memory devices further comprises a conductive channel through said n+ emitter region to said p+ base region, said p-n junction programmable memory device thereby storing a 1.

34. A device according to claim 29, wherein each of said plurality of p-n junction programmable memory devices comprises a p⁻ substrate, a diode cathode region formed on said p⁻ substrate comprising an n layer and an n+ buried region formed at the junction of said p⁻ substrate and said n layer, a diode anode p+ region formed in said n layer, an insulating layer formed on said n layer and on a portion of said p+ anode layer, a first metal electrode formed on a portion of said insulating layer and on the remaining portion of said p+ anode layer, a chalocogenied glass layer formed on said first metal electrode, and a second metal electrode formed on said chalocogenied glass layer, said p-n junction programmable memory device thereby storing a 0.

35. A device according to claim 34, wherein each of said plurality of p-n junction programmable memory devices further comprises a conductive channel through said chalocogenied glass layer extending from said second metal electrode to said first metal electrode, said p-n junction programmable memory device thereby storing a 1.

36. A device according to claim 29, wherein each of said plurality of p-n junction programmable memory devices comprises a p⁻ substrate, a diode cathode region comprising an n layer formed on said p⁻ substrate and a n+ buried region formed at the junction of said p⁻ substrate and said buried n+ region, a p+ diode anode region formed in said n layer, an insulating layer formed on said n layer and on a portion of said p+ diode anode region, a first metal electrode formed on said insulating layer and on the remaining portion of said p+ diode anode region, a second metal electrode formed on said insulating layer and spaced apart from said first metal electrode, and a conductive fuse layer formed on said first and second metal electrode layers and in a space between said first and second metal electrode layers, and wherein at least one of said plurality of p-n junction programmable memory devices has said first and second metal electrode layers electrically connected through said conductive fuse layer, said p-n junction programmable memory device thereby storing a 0.

37. A device according to claim 36, wherein said conductive fuse layer of at least one of said p-n junction programmable memory devices is electrically disconnected from said first and second metal electrodes, said p-n junction programmable memory device thereby storing a 1.

38. A device according to claims 1, 2, 3, or 4, wherein said memory cells of said array are divided into a plurality of memory cell groups each having an output, and wherein said device further comprises a multiplexer circuit having a plurality of inputs respectively, operatively connected to said outputs of said plurality of memory cell groups.

39. A method of testing a field programmable device comprising a memory cell array including memory cells, a plurality of bit lines and a plurality of word lines at angles with and intersecting said bit lines, said memory cells being divided into memory cell groups each having an output; test rows, each having a specified write-in ratio, said test rows having at least one test row with a write-in ratio different from said write-in ratio of each of the remainder of said test rows; and a multiplexer circuit having an output, and a plurality of inputs respectively, operatively connected to said outputs of said memory cell groups, said method comprising the steps of:
  (a) applying a predetermined code to said plurality of inputs of said multiplexer circuit,
  (b) measuring current and voltage levels at said plurality of inputs of said multiplexer circuit,
  (c) measuring current and voltage levels at said output of said multiplexer circuit, and
  (d) comparing said measured current and voltage levels with predetermined values, whereby the multiplexer circuit is determined to be normal or abnormal.

40. A method of storing n bit code patterns in a semiconductor device having memory cells divided into n bit groups, bit lines operatively connected to corresponding ones of said memory cells, word lines operatively connected to corresponding ones of said memory cells, test rows respectively, operatively connected to corresponding ones of said groups of memory cells, each of said corresponding groups of memory cells storing a corresponding one of said code patterns, each of said code patterns formed in accordance with the steps of:
  (a) storing a beginning code $\overline{A_0}A_0$, with $A_0=1$ in a first one of said n bit memory cell groups, said beginning code corresponding to a first two bits of one of said n bit code patterns;
  (b) concatenating to the right of said beginning code an inverted beginning code $A_0\overline{A_0}$, thereby forming a current code, said current code corresponding to adjacent bits of said n bit code pattern, and stored in bits adjacent to bits of said first one of said n bit memory cell groups already comprising a portion of said n bit code pattern;
  (c) concatenating to the right of said current code the inversion of said current code, thereby forming a code corresponding to adjacent bits of said n bit code pattern, and stored in bits adjacent to bits of said first one of said n bit memory cell groups already comprising a portion of said n bit code pattern; and
  (d) repeating step (c) until said n bit positions are formed and stored in respective bits of said one of said n bit memory cell groups.

* * * * *

UNITED STATES PATENT AND TRADEMARK OFFICE
CERTIFICATE OF CORRECTION

PATENT NO. : 4,429,388

DATED : January 31, 1984

INVENTOR(S) : Fukushima et al.

It is certified that error appears in the above-identified patent and that said Letters Patent is hereby corrected as shown below:

```
Column 3, line 36, "to" should be --in--;
          line 42, delete "1";
          line 42, after "level" insert --1--;
          line 46, "out" should be --cut--;
Column 4, line 21, "A̅₀" should be --A₀--;

line 55, delete "of" (first occurrence);
Column 5, line 1, delete " " " ;
          line 9, delete "in" (second occurrence);
          line 10, "constantly produces" should be --is at
a constant--;
          line 11, delete "output" (first occurrence);
          line 31, "state, when" should be --state, or when--;
          line 57, delete "and";
          TABLE 2, "code" should be --case/code--;
Column 6, line 12, delete "in";
          line 22, after "selection" insert --,--;
```

UNITED STATES PATENT AND TRADEMARK OFFICE
CERTIFICATE OF CORRECTION

PATENT NO. : 4,429,388

DATED : January 31, 1984

INVENTOR(S) : Fujushima et al.

It is certified that error appears in the above-identified patent and that said Letters Patent is hereby corrected as shown below:

```
Column 6, line 28, delete "the" (second occurrence);
          line 34, after "of" insert --the--;
          line 35, delete "the" (first occurrence);
          line 56, delete "," (first occurrence);
Column 7, line 39, after "and" insert --the--; (1st occurr.)
          line 42, delete "in";
          line 62, "that" should be --than--;
Column 8, line 42, "above practically" should be --above.
          Practically--;
Column 9, line 3, "capabilities" should be --capacitances--;
          line 5, after "12B," insert --has--;
Column 10, line 22, "ot" should be --or--;
Column 12, line 68, "portion" should be --region--.
```

Signed and Sealed this

Thirtieth Day of April 1985

[SEAL]

Attest:

DONALD J. QUIGG

Attesting Officer    Acting Commissioner of Patents and Trademarks